United States Patent
Park et al.

(10) Patent No.: US 11,506,721 B2
(45) Date of Patent: Nov. 22, 2022

(54) METHOD FOR DETERMINING SECTION IN WHICH GENERATION OF INTERNAL GAS IN SECOND BATTERY ACCELERATES

(71) Applicant: LG CHEM, LTD., Seoul (KR)

(72) Inventors: Ji Hye Park, Daejeon (KR); Su Hyun Kim, Daejeon (KR); Dong Guk Hwang, Daejeon (KR)

(73) Assignee: LG Energy Solution, Ltd., Seoul (KR)

( * ) Notice: Subject to any disclaimer, the term of this patent is extended or adjusted under 35 U.S.C. 154(b) by 195 days.

(21) Appl. No.: 16/967,075

(22) PCT Filed: Sep. 30, 2019

(86) PCT No.: PCT/KR2019/012707
§ 371 (c)(1),
(2) Date: Aug. 3, 2020

(87) PCT Pub. No.: WO2020/085667
PCT Pub. Date: Apr. 30, 2020

(65) Prior Publication Data
US 2021/0048481 A1    Feb. 18, 2021

(30) Foreign Application Priority Data

Oct. 25, 2018   (KR) .................. 10-2018-0128396

(51) Int. Cl.
*G01R 31/392* (2019.01)
*H02J 7/00* (2006.01)
(Continued)

(52) U.S. Cl.
CPC ......... *G01R 31/392* (2019.01); *G01R 31/396* (2019.01); *H01M 10/44* (2013.01);
(Continued)

(58) Field of Classification Search
CPC .... H02J 7/0013; H02J 7/0048; H02J 7/00719; G01R 31/392; G01R 31/396; H01M 10/44; H01M 10/48
(Continued)

(56) References Cited

U.S. PATENT DOCUMENTS

| | | |
|---|---|---|
| 6,456,042 B1 | 9/2002 | Kwok |
| 10,393,817 B2 | 8/2019 | Bruch et al. |

(Continued)

FOREIGN PATENT DOCUMENTS

| | | |
|---|---|---|
| AU | 6898696 A | 3/1997 |
| CN | 102138248 A | 7/2011 |

(Continued)

OTHER PUBLICATIONS

International Search Report (with partial translation) and Written Opinion issued in corresponding International Patent Application No. PCT/KR2019/012707, dated Jan. 2, 2020.
(Continued)

*Primary Examiner* — Melissa J Koval
*Assistant Examiner* — Trung Q Nguyen
(74) *Attorney, Agent, or Firm* — Morgan, Lewis & Bockius LLP

(57) ABSTRACT

The present invention relates to a method for determining a section in which generation of internal gas in a second battery accelerates, the method comprising the steps of: measuring a closed circuit voltage (CCV) and an open circuit voltage (OCV) according to the state of charge (SOC) of the secondary battery while charging the secondary battery; deriving a closed circuit voltage (SOC-CCV) profile according to the state of charge and an open circuit voltage (SOC-OCV) profile according to the state of charge; and determining, from the derived SOC-CCV profile and SOC-
(Continued)

OCV profile, a section in which the amount of internal gas generated in the secondary battery rapidly increases.

12 Claims, 3 Drawing Sheets

(51) Int. Cl.
  *H01M 10/44* (2006.01)
  *G01R 31/396* (2019.01)
  *H01M 10/48* (2006.01)
(52) U.S. Cl.
  CPC .......... *H01M 10/48* (2013.01); *H02J 7/0013* (2013.01); *H02J 7/0048* (2020.01); *H02J 7/00719* (2020.01)
(58) Field of Classification Search
  USPC ......................................... 324/400, 430–434
  See application file for complete search history.

(56) References Cited

U.S. PATENT DOCUMENTS

| | | | | |
|---|---|---|---|---|
| 2015/0323607 | A1* | 11/2015 | Rink | ................ G01R 31/36 324/426 |
| 2016/0259011 | A1* | 9/2016 | Joe | ................ G01R 31/367 |
| 2017/0146610 | A1 | 5/2017 | Cha et al. | |
| 2020/0313152 | A1* | 10/2020 | Stefanopoulou | ...... B60L 3/0046 |

FOREIGN PATENT DOCUMENTS

| | | |
|---|---|---|
| CN | 104488114 A | 4/2015 |
| CN | 105142948 A | 12/2015 |
| CN | 105277899 A | 1/2016 |
| CN | 107078364 A | 8/2017 |
| CN | 108603918 A | 9/2018 |
| DE | 102015205228 A1 | 9/2016 |
| JP | 2006-337155 A | 12/2006 |
| JP | 2007-053058 A | 3/2007 |
| JP | 2011-003513 A | 1/2011 |
| JP | 2014-003737 A | 1/2014 |
| JP | 2014-007821 A | 1/2014 |
| JP | 5413507 B2 | 2/2014 |
| JP | 2014-044929 A | 3/2014 |
| JP | 2016-093066 A | 5/2016 |
| JP | 5994680 B2 | 9/2016 |
| JP | 2017-073337 A | 4/2017 |
| JP | 2017-181212 A | 10/2017 |
| KR | 10-2018-0031205 A | 3/2018 |
| WO | 97/07582 A1 | 2/1997 |
| WO | 9707582 A1 | 2/1997 |

OTHER PUBLICATIONS

Extended European Search Report issued in corresponding European Patent Application No. 19875621.5, dated Dec. 11, 2020.

* cited by examiner

[FIG. 1]
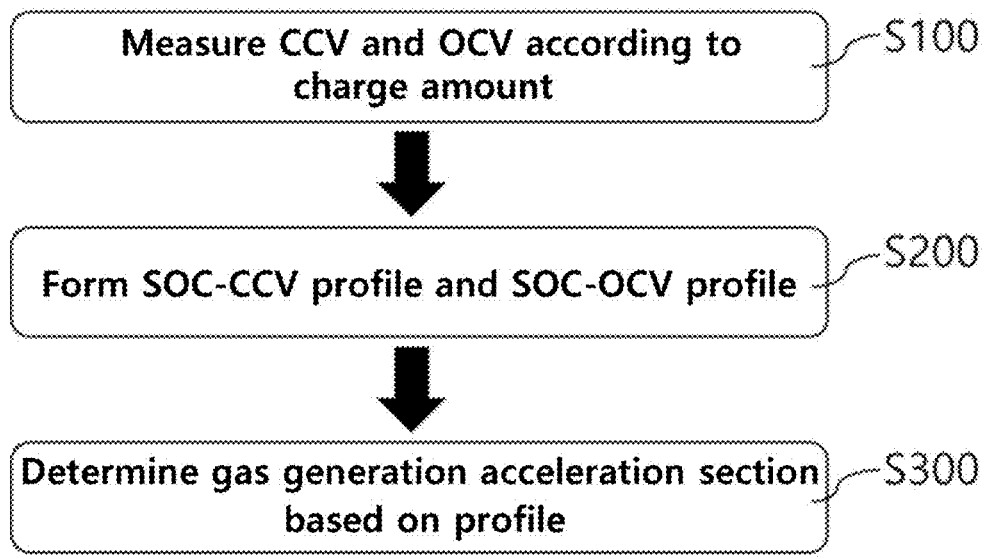
[FIG. 2]
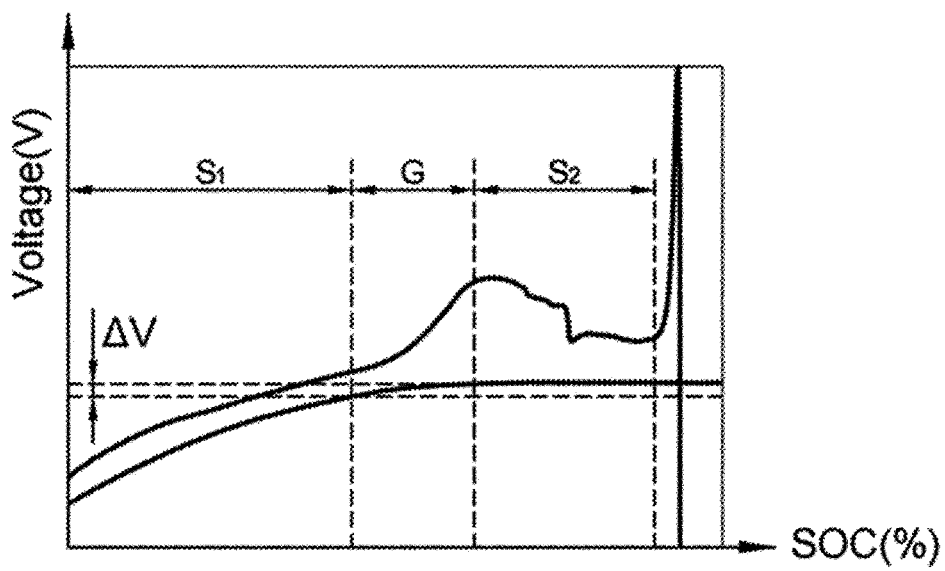

[FIG. 3]
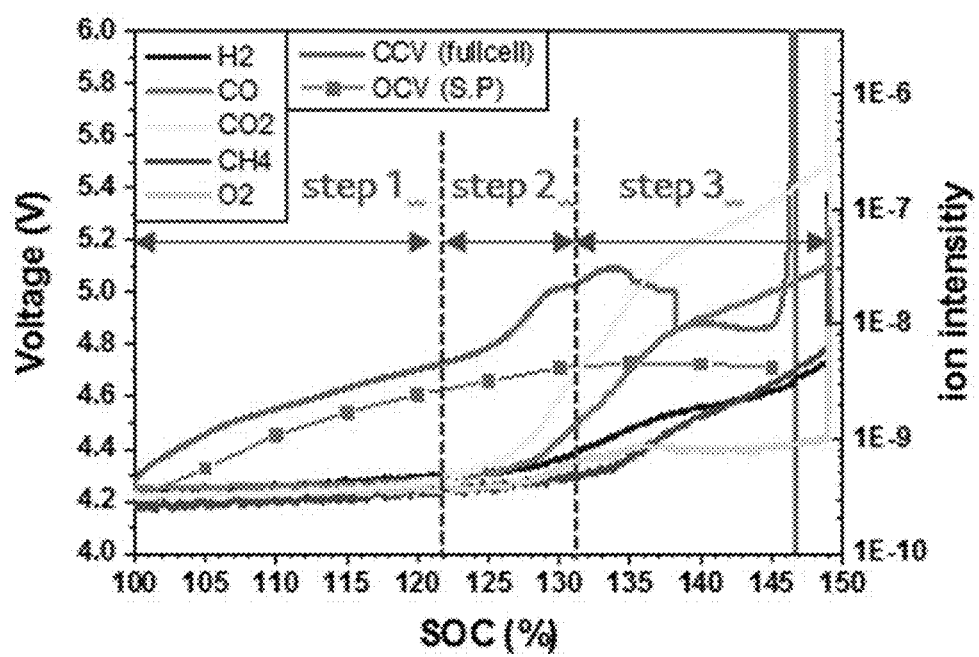

[FIG. 4]
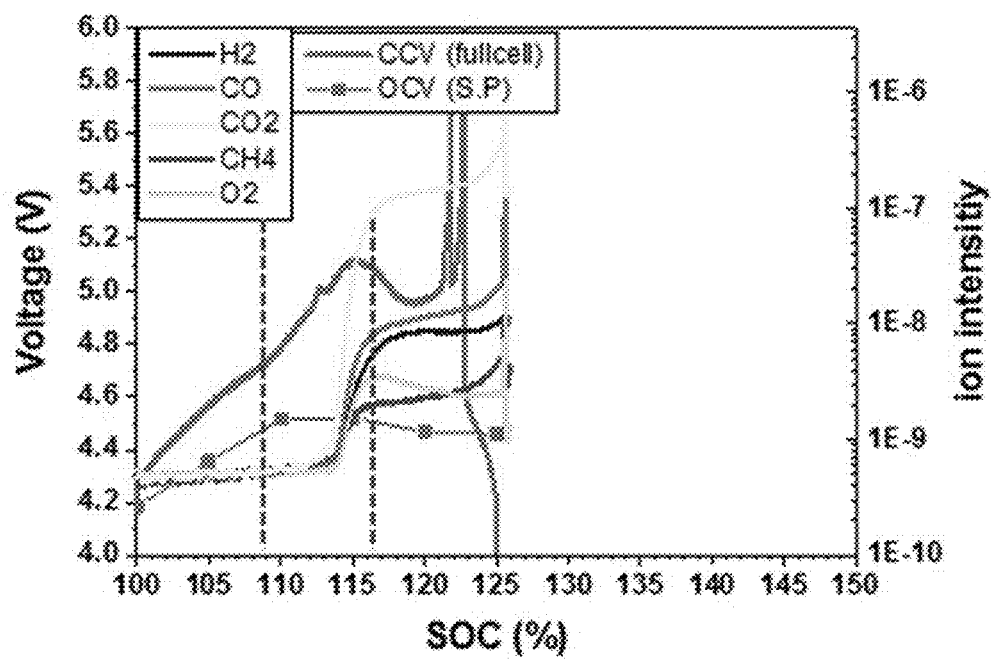

METHOD FOR DETERMINING SECTION IN WHICH GENERATION OF INTERNAL GAS IN SECOND BATTERY ACCELERATES

TECHNICAL FIELD

This application claims the benefit of priority based on Korean Patent Application No. 10-2018-0128396, filed on Oct. 25, 2018, and the entire contents of the Korean patent application are incorporated herein by reference.

The present invention relates to a method for determining a section in which the amount of gas generated internally at the time of ignition or explosion due to overcharging of a secondary battery increases rapidly.

BACKGROUND ART

Recently, secondary batteries capable of charging and discharging have been widely used as energy sources of wireless mobile devices. In addition, the secondary battery has attracted attention as an energy source of an electric vehicle, a hybrid electric vehicle, etc., which are proposed as a solution for air pollution of existing gasoline vehicles and diesel vehicles using fossil fuel.

Small devices such as mobile phones and cameras use small battery packs packed with one secondary battery cell, whereas medium and large devices such as laptops and electric vehicles use medium or large battery packs in which two or more secondary battery cells are connected in parallel and/or in series.

Such secondary batteries may be classified into lithium ion batteries, lithium ion polymer batteries, lithium polymer batteries, etc., depending on the composition of the electrode and the electrolyte, and among them, the amount of use of lithium-ion polymer batteries that are less likely to leak electrolyte and are easy to manufacture is on the increase.

On the other hand, the lithium secondary battery has a problem of low safety while having excellent electrical properties. For example, lithium secondary batteries generate heat and gas due to decomposition reaction of active materials and electrolytes, which are battery components, under abnormal operating conditions such as overcharge, overdischarge, exposure to high temperatures, and electrical short circuits, and the resistance of the battery increases and gas generation is accelerated, which may cause ignition or explosion.

In addition, the safety problem of the secondary battery is more serious in the medium-large cell module of the multi-cell structure. It is because a large number of battery cells are used in a cell module having a multi-cell structure, so that an abnormal operation in some battery cells may cause a chain reaction to other battery cells, and ignition and explosion due thereto may result in large accidents.

Accordingly, the necessity for safety evaluation due to overcharging, high temperature exposure, etc. of the secondary battery is increasing. In particular, there is a need for measuring a sudden increase time of gas generated inside the secondary battery. However, the explosion of the medium and large cell module is not only a risk that can be caused by a large accident by the chain reaction as described above, but also due to the structural deformation of the measuring device, it is difficult to measure the time of sudden increase of gas, etc.

As such, there is a demand for a method for measuring an acceleration time point of generation of gas generated therein due to overcharging when evaluating the safety of secondary batteries.

DISCLOSURE

Technical Problem

An object of the present invention is to provide a method of determining a gas generation acceleration section, that is, a section in which the amount of gas is rapidly increased, without actually analyzing the gas generated inside the secondary battery.

Technical Solution

A method for determining an internal gas generation acceleration section of a secondary battery according to an embodiment of the present invention includes: measuring a closed circuit voltage (CCV) and an open circuit voltage (OCV) according to a charge amount (SOC) of the secondary battery while charging the secondary battery; deriving the closed circuit voltage (SOC-CCV) profile according to the charge amount and the open circuit voltage (SOC-OCV) profile according to the charge amount; and determining a section in which an internal gas generation amount of the secondary battery is rapidly increased from the derived SOC-CCV profile and SOC-OCV profile.

Herein, in the SOC-CCV profile, a section, in which the closed circuit voltage is continuously increased and a slope of the SOC-OCV profile is decreased, may be determined as a section in which the gas generation amount is rapidly increased.

In an embodiment of the present invention, the section in which the gas generation amount increases rapidly may be a charge amount section in which the slope of the SOC-CCV profile is the same or increased compared to the previous section, and the slope may decrease in a subsequent section.

In an embodiment of the present invention, the section in which the gas generation amount increases rapidly may be a charge amount section in which the slope of the SOC-CCV profile increases more than 1.2 times compared to the previous section.

In an embodiment of the present invention, in the section in which the gas generation amount increases rapidly, a slope change rate of the SOC-OCV profile may be less than ±5%.

In an embodiment of the present invention, in the section in which the gas generation amount is rapidly increased, the change value of the open circuit voltage may be ±10~200 mV.

In an embodiment of the present invention, the closed circuit voltage and the open circuit voltage may be continuously increased before the section in which the gas generation amount rapidly increases.

In an embodiment of the present invention, the secondary battery may include one or more small cells having a capacity of 1 Ah or less, and the small cells may be electrically connected to each other.

In an embodiment of the present invention, an internal gas generation acceleration section for a medium-large cell module may be predicted by charging the small cell under a simulation condition of the medium-large cell module.

In an embodiment of the present invention, the simulation condition of the medium-large cell module may be a condition that a front surface of the small cell is wrapped with a heat insulating member in order to block a heat leakage to an outside.

In one embodiment of the present invention, the medium-large cell module may include one or more medium-large cells having a capacity of 20 Ah or more.

The medium-large cell module may be used as a power source for an electric vehicle, a hybrid electric vehicle, a plug-in hybrid electric vehicle, or a power storage device.

Advantageous Effects

According to an exemplary embodiment of the present invention, the internal gas generation acceleration section may be determined only by the profile of the closed circuit voltage and the open circuit voltage according to the charge amount, without actually analyzing gases generated at the time of ignition due to the overcharging of the secondary battery. This eliminates the need for a separate gas analysis device, thereby reducing the safety test cost of the secondary battery.

In addition, various improvement methods, such as gas removal and exhaust system, may be easily applied based on the generation acceleration section. Further, since the gas generation acceleration section can be confirmed only by the voltage profile, the gas generation acceleration section can be confirmed regardless of the material of the active material and the capacity of the secondary battery.

BRIEF DESCRIPTION OF THE DRAWINGS

FIG. 1 is a flowchart schematically illustrating a method of determining an internal gas generation acceleration section of a secondary battery according to an embodiment of the present invention.

FIG. 2 schematically illustrates an SOC-OCV profile and an SOC-CCV profile for determining a gas generation acceleration section.

FIGS. 3 and 4 show SOC-OCV profiles and SOC-CCV profiles according to Examples 1 and 2, respectively.

DETAILED DESCRIPTION OF THE PREFERRED EMBODIMENTS

As the inventive concept allows for various changes and numerous embodiments, particular embodiments will be illustrated in the drawings and described in detail in the text. However, this is not intended to limit the present invention to the specific form disclosed, and it should be understood to include all changes, equivalents, and substitutes included in the spirit and scope of the present invention.

In describing the drawings, similar reference numerals are used for similar elements. In the accompanying drawings, the dimensions of the structures are shown in an enlarged scale for clarity of the invention. Terms such as "first" and "second" may be used to describe various components, but the components should not be limited by the terms. The terms are used only for the purpose of distinguishing one component from another. For example, without departing from the scope of the present invention, a first component may be referred to as a second component, and similarly, the second component may also be referred to as the first component. Singular expressions include plural expressions unless the context clearly indicates otherwise.

In this application, it should be understood that terms such as "include" or "have" are intended to indicate that there is a feature, number, step, operation, component, part, or a combination thereof described on the specification, and they do not exclude in advance the possibility of the presence or addition of one or more other features or numbers, steps, operations, components, parts or combinations thereof. Also, when a portion such as a layer, a film, an area, a plate, etc. is referred to as being "on" another portion, this includes not only the case where the portion is "directly on" the another portion but also the case where further another portion is interposed therebetween. On the other hand, when a portion such as a layer, a film, an area, a plate, etc. is referred to as being "under" another portion, this includes not only the case where the portion is "directly under" the another portion but also the case where further another portion is interposed therebetween. In addition, to be disposed "on" in the present application may include the case disposed at the bottom as well as the top.

Hereinafter, a method of determining an internal gas generation acceleration section of a secondary battery according to an embodiment of the present invention will be described with reference to the drawings.

FIG. 1 is a flowchart schematically illustrating a method of determining an internal gas generation acceleration section of a secondary battery according to an embodiment of the present invention, and FIG. 2 schematically illustrates an SOC-OCV profile and an SOC-CCV profile for determining a gas generation acceleration section.

A method for determining an internal gas generation acceleration section of a secondary battery according to an embodiment of the present invention includes: measuring a closed circuit voltage (CCV) and an open circuit voltage (OCV) according to a charge amount (SOC) of the secondary battery while charging the secondary battery (S100); deriving the closed circuit voltage (SOC-CCV) profile according to the charge amount and the open circuit voltage (SOC-OCV) profile according to the charge amount (S200); and determining a section in which an internal gas generation amount of the secondary battery is rapidly increased from the derived SOC-CCV profile and SOC-OCV profile (S300).

First, while charging the secondary battery, the step (S100) of measuring the closed circuit voltage (CCV) and the open circuit voltage (OCV) according to the charge amount (SOC) of the secondary battery may be measuring the closed circuit voltage (CCV) and open circuit voltage (OCV) according to the charge amount while charging the secondary batteries and, at the same time, inducing gas generation of secondary batteries while continually increasing the charge amount.

The secondary battery may generate heat and gas by causing decomposition reactions of active materials, electrolytes, and the like, which are battery components, by overcharge, and the high temperature and high pressure conditions caused by the secondary battery may further accelerate the decomposition reaction and cause fire or explosion. Since the present invention is to determine a charge amount section in which the gas generation amount is rapidly increased during the safety test, the charge amount (SOC) of the secondary battery is continuously increased by continuously applying a charging current to the secondary battery to be inspected to induce gas generation.

In this case, by applying a charging current by using 200% limit of the charge amount SOC, an explosion of the secondary battery may be induced, but the present invention is not limited thereto, and overcharging may be performed until the secondary battery is exploded. As described above, the overcharge may be performed after limiting the upper limit voltage to about twice the operating voltage without using the charge amount as the reference value.

On the other hand, overcharging may be performed through a charge/discharge unit disposed on one side of the chamber after mounting the secondary battery in the chamber of the analysis device. The chamber may include a chamber body and a chamber cover, and the chamber body may have a hollow structure with an open top. In addition, the shape and size of the chamber body on the plane are not limited and may have a cube shape or a cuboid shape as a shape and size of the secondary battery mounted therein. The chamber cover may be coupled with an opening of the chamber body in order to seal a secondary battery mounted inside the chamber body. The chamber body and the chamber cover are not particularly limited as long as the chamber body and the chamber cover can be firmly coupled, but may be coupled by fixing means such as fixing pins, screws, and bolts. In addition, an O-ring or the like may be further used between the chamber body and the chamber cover in order to increase the coupling force of the chamber body and the chamber cover. The inner surface of the chamber may be an insulating and heat-insulating material, and a material resistant to high temperature and high pressure, and non-limiting examples thereof may be bakelite, teflon, aerosol, or the like. The outer surface surrounding the inner surface may be made of a material such as stainless steel or metal. Meanwhile, the inside of the chamber may be formed in a vacuum state so as to derive a more accurate result value.

In addition, the charge/discharge unit may include a power supply unit and a measuring unit. The power supply unit may be electrically connected to the secondary battery mounted through the charge/discharge terminals. Specifically, charge/discharge terminals are provided at one side of the chamber, and may be electrically connected to an electrode of a secondary battery in which the charge/discharge terminals are mounted.

The measurement of the closed circuit voltage CCV and the open circuit voltage OVC according to the charge amount SOC of the secondary battery may be simultaneously performed while applying a charging current to the secondary battery to be inspected, but is not limited thereto. Further, the charging current may be applied up to a specific charging amount SOC, and the voltage may be measured after the secondary battery is left.

In the present invention, the closed circuit voltage is a voltage of the secondary battery in a state where a current is applied to the secondary battery, and the open circuit voltage means a voltage of a secondary battery in a state in which no current is applied to the secondary battery. The closed circuit voltage according to the SOC can be measured by measuring the voltage when reaching a specific SOC while continuously charging, and the open circuit voltage according to the charge amount of the secondary battery can be measured by repeating the process of charging up to a specific charge amount, leaving the battery for at least one hour and then measuring the voltage. At this time, the time to leave the secondary battery for measurement of the open circuit voltage is not limited to the above numerical value.

In one embodiment of the present invention, the step S100 of measuring the closed circuit voltage CCV and the open circuit voltage OCV according to the charge amount SOC may be performed through the above-described measuring unit. Accordingly, the voltage of the secondary battery can be measured in real time while applying current to the secondary battery. The voltage measured by the measuring unit may be stored in a separate storage unit, and the voltage profile described below may be formed using the stored voltage measurement value.

The step of deriving the profile of the closed circuit voltage (CCV) and the open circuit voltage (OCV) according to the charge amount (SOC) (S200) is a step of forming measured values of the SOC-CCV according to the measuring step (S100) and a graph showing the measured values.

Specifically, as shown in FIG. 2, the SOC-CCV profile and the SOC-OCV profile can be formed by setting the charge amount SOC on the horizontal axis and the closed circuit voltage CCV and the open circuit voltage OCV on the vertical axis, respectively, and plotting each measurement value on a graph.

Thereafter, a step S300 of determining a generation acceleration section of gas generated inside the secondary battery may be performed based on the behavior of the SOC-CCV profile and the SOC-OCV profile.

In particular, according to the method of determining the generation acceleration section of the gas, a section in which the closed circuit voltage continuously increases in the SOC-CCV profile and the slope of the SOC-OCV profile decreases is determined as a section in which the gas generation amount rapidly increases.

Referring to FIG. 2, the closed circuit voltage shows a tendency to continuously increase as charging progresses, and after a period of rapid increase in speed, a short occurs due to an increase in resistance of the secondary battery. At this time, the gas generation acceleration section (G) may be a charge amount section in which the closed circuit voltage according to the amount of charge is continuously increased, or the slope of the SOC-CCV profile is increased or the same when compared to that of the previous period ($S_1$). Thereafter, the slope of the SOC-CCV profile may be decreased in the following section $S_2$.

In an embodiment of the present invention, the gas generation acceleration section G may be a charging amount section in which the slope of the SOC-CCV profile is increased by 1.2 times or more when compared to the acceleration section $S_1$.

In addition, a trend that the closed circuit voltage is continuously increased is shown before the gas generation acceleration section ($S_1$), and a trend that the slope of the closed circuit voltage decreases may be shown thereafter ($S_2$). Further, as the overcharging continues, the resistance of the secondary battery increases, resulting in a short circuit.

On the other hand, the open circuit voltage shows a tendency to continuously increase as the overcharge proceeds, it can be seen that the increase rate is slowed from a certain section. In this case, the generation acceleration section G of the gas may be a charging amount section in which the increase rate of the open circuit voltage is slowed, that is, the slope of the SOC-OCV profile decreases. In an embodiment of the present invention, the slope change rate of the SOC-OCV profile may be less than ±5% and the change value ΔV of the open circuit voltage may be ±10 to 200 mV in the gas acceleration section G.

In addition, before the section in which the generation amount of gas is rapidly increased ($S_1$), the closed circuit voltage and the open circuit voltage may have a trend that continues to increase, respectively.

As described above, according to the present invention, in the SOC-CCV profile and the SOC-OCV profile, a section in which the slope of the SOC-OCV profile decreases while the closed circuit voltage is continuously increased is determined as a section in which the gas generation amount rapidly increases.

Therefore, in the present invention, the internal gas generation acceleration section may be determined only by the profile of the closed circuit voltage and the open circuit voltage according to the charging amount, without substantially analyzing the gas generated at the time of the ignition due to the overcharging of the secondary battery. This eliminates the need for a separate gas analysis device, thereby reducing the cost of safety testing the secondary battery.

In addition, various improvement methods, such as gas removal and exhaust system at the time of the overcharge of the secondary battery, may be easily applied based on the acceleration section of gas generation. In addition, since the gas generation acceleration section can be confirmed only by the voltage profile, the gas generation acceleration section can be confirmed regardless of the material of the active material and the capacity of the secondary battery.

Meanwhile, secondary batteries used in the present invention may include one or more small cells each having a capacity of 1 Ah or less, and the small cells may be electrically connected to each other. The small cell is used in a small device such as a mobile phone, a camera, and the like, and there is no limitation in the appearance of the cell, but the cell may be a cylindrical, square, pouch, coin type, or the like using a can.

According to the present invention, the internal gas generation acceleration section for the medium-large cell module can be predicted using small cells.

In general, a large number of battery cells are used in a medium-large cell module having a multi-cell structure, so that an abnormal operation in some battery cells may cause a chain reaction to other battery cells, and ignition and explosion due thereto may result in large accidents. Accordingly, the necessity for safety evaluation due to overcharging, high temperature exposure, etc. of the medium-large cell module is increasing. In particular, there is a need for measuring a sudden increase time of gas generated inside the medium-large cell module due to overcharging. However, the explosion of the medium and large cell module is not only a risk that can be caused by a large accident by the chain reaction as described above, but also due to the structural deformation of the measuring device, it is difficult to measure the time of sudden increase of gas, etc.

Accordingly, the present invention proposes a method of predicting an internal gas generation acceleration section for a medium-large cell module by charging a small cell under simulated conditions of the medium-large cell module without directly testing the medium-large cell module.

In general, when a small cell performs a simple overcharge, the voltage and temperature according to the charge amount tend to be different compared to that of the medium-large cell module, and the explosion does not occur even after the charge point at which the medium-large cell module explodes. This is because the temperature of the battery does not increase rapidly even if the decomposition reaction of the electrolyte occurs due to overcharging in the small cell. On the other hand, in the case of the medium-large cell module, the battery temperature rises rapidly due to overcharging.

Thus, in the present invention, in the process of charging the small cell, in order to simulate the medium-large module, the front surface of the small cell to be examined is characterized in that it is wrapped with a heat insulating member. Thus, charging is performed after the front surface of the small cell is wrapped with insulation, so that when overcharged, the calorific value does not leak to the outside of the battery, thereby accelerating the temperature rise of the small cell and becoming the same as the voltage and temperature profile according to the charge amount of the medium-large cell module.

At this time, non-limiting examples of the insulating member include at least one of glasswool, EPS (Expanded Polystyrene), XPS (Extruded Polystyrene Sheet), polyurethane foam, aqueous flexible foam, urea foam (Urea Foam), vacuum insulation panel, PVC, and heat reflective insulation, but any material that can be retained in the internal space without exiting the heat generated by the overcharging of the secondary battery to the external space may be used without particular limitation.

One or more above-described small cells are included, and the small cells are electrically connected. By performing the gas generation acceleration section determination method according to the present invention by allowing the insulating member to surround the front surface of the secondary battery to be inspected, the gas generation acceleration section of the medium-large cell module may be determined.

Meanwhile, the medium-large cell module is used in medium-large devices such as notebooks and electric vehicles, and one or more medium-large cells having a capacity of 20 Ah or more may be connected in parallel and/or in series. The medium-large cell module may be used as a power source of an electric vehicle, a hybrid electric vehicle, a plug-in hybrid electric vehicle, or a power storage device.

Hereinafter, the present invention will be described in detail with reference to Examples, but the following Examples are merely to illustrate the present invention, and the present invention is not limited by the following Examples.

Example 1

After connecting three small cells (1 Ah) containing $Li(Ni_{0.6}Co_{0.2}Mn_{0.2})O_2$ (NMC 622) as a positive electrode active material in series, the front surface was wrapped with a heat insulating material to prepare a test target battery. While the charging current was applied to the battery to be inspected, the open circuit voltage according to the charging amount and the closed circuit voltage according to the charging amount were measured, respectively. The measured values were plotted to obtain an SOC-OCV profile and an SOC-CCV profile, which are shown in FIG. 3. Further, in FIG. 3, the section G, in which the slope of the SOC-OCV profile decreases (the rate of increase of the OCV slowed down) while the CCV continuously increases or the CCV rapidly increases (the slope of the SOC-CCV profile increases), was determined as a section in which the gas generation amount rapidly increases.

Example 2

A SOC-OCV profile and a SOC-CCV profile were obtained in the same manner as in Example 1, except that $Li(Ni_{0.8}Co_{0.1}Mn_{0.1})O_2$ (NMC 811) was used as the positive electrode active material of the small cell, which is shown in FIG. 4. Further, in FIG. 4, the section G, in which the increase rate of OCV is slowed or the change value $\Delta V$ of the OCV is 100 mV or less while the slope of the SOC-CCV profile is slightly increased or the same compared to the previous section, was determined as the section where the gas generation amount rapidly increases.

Experimental Example

After preparing the same battery as the cells to be inspected in Examples 1 and 2, the charging current was applied to measure the ionic strength of the gas according to the charging amount in real time. These are shown in FIGS. 3 and 4, respectively.

Referring to FIGS. 3 and 4, although the material of the positive electrode active material is different, it can be seen that the increase rate of the closed circuit voltage according to the charging amount in the section G is high, and the increase rate of the open circuit voltage is lowered.

More specifically, in the case of Example 1, it can be seen that the slope of the closed circuit voltage in the G section, which is the gas generation acceleration section, is the same or increased compared to before the acceleration section ($S_1$), and the slope of the open circuit voltage is slightly decreased. In the case of Example 2, the increase rate of the closed circuit voltage is same or slightly increased compared to the previous section $S_1$, and the open circuit voltage is slowed or changed to a decreasing trend, and the change value is about 100 mV or less.

On the other hand, in the G section determined as a gas generation acceleration section by the determination method of the present invention, it can be seen that the ion concentration of the gas actually increases rapidly.

Therefore, the gas acceleration interval determination method of the present invention may determine the gas generation acceleration section through the SOC-CCV and SOC-OCV profile even if the gas generation amount is not actually measured or analyzed.

In addition, as the medium-large cell module is simulated from the small cell in the embodiment, the gas generation acceleration section of the medium-large cell module is also expected to be the same.

As such, in the method according to the present invention, since a separate gas analysis equipment does not need to be equipped, the safety test cost of the secondary battery can be reduced, and based on the gas generation acceleration section, it may be easy to apply various improvement methods such as gas removal and exhaust system when the secondary battery is overcharged. In addition, since the gas generation acceleration section can be confirmed only by the voltage profile, the gas generation acceleration section can be confirmed regardless of the material of the active material and the capacity of the secondary battery.

Although the above has been described with reference to a preferred embodiment of the present invention, it can be understood that those skilled in the art can make various modifications and changes to the present invention without departing from the spirit and scope of the invention as set forth in the claims below.

Therefore, the technical scope of the present invention should not be limited to the contents described in the detailed description of the specification but should be defined by the claims.

The invention claimed is:

1. A method for determining an internal gas generation acceleration section of a secondary battery, the method comprising:
preparing the secondary battery including one or more small cells having a capacity of 1 Ah or less, wherein the small cells are electrically connected to each other,
measuring a closed circuit voltage (CCV) and an open circuit voltage (OCV) according to a charge amount (SOC) of the secondary battery while charging the secondary battery;
deriving a closed circuit voltage profile (SOC-CCV profile) according to the charge amount and an open circuit voltage profile (SOC-OCV profile) according to the charge amount;
detecting a section in which the closed circuit voltage is continuously increased and a slope of the SOC-OCV profile is decreased; and
determining the section as a part of the secondary battery in which an internal gas generation amount of the secondary battery is rapidly increased.

2. The method of claim 1, wherein
the section is a charge amount section in which a slope of the SOC-CCV profile is the same as or increased compared to a slope of the SOC-CCV profile of a previous section, and
the slope of the SOC-CCV profile decreases in a subsequent section.

3. The method of claim 2, wherein the section in which the gas generation amount increases rapidly is a charge amount section in which the slope of the SOC-CCV profile increases more than 1.2 times compared to the previous section.

4. The method of claim 1, wherein in the section, a slope change rate of the SOC-OCV profile is less than ±5%.

5. The method of claim 1, wherein in the section, a change value in the open circuit voltage is ±10 to 200 mV.

6. The method of claim 1, wherein the closed circuit voltage and the open circuit voltage are continuously increased before the section in which the gas generation amount rapidly increases.

7. The method of claim 1, wherein an internal gas generation acceleration section for a medium-large cell module is predicted by charging the small cell under a simulation condition of the medium-large cell module.

8. The method of claim 7, wherein the simulation condition of the medium-large cell module is a condition that a front surface of the small cell is wrapped with a heat insulating member in order to block a heat leakage to an outside.

9. The method of claim 8, wherein the heat insulating member includes at least one of expanded polystyrene (EPS), extruded polystyrene sheet (XPS), polyurethane foam, aqueous flexible foam, urea foam, vacuum insulation panel, polyvinyl chloride, or heat reflective insulation.

10. The method of claim 7, wherein the medium-large cell module includes one or more medium-large cells having a capacity of 20 Ah or more.

11. The method of claim 10, wherein the medium-large cell module is used as a power source for an electric vehicle, a hybrid electric vehicle, a plug-in hybrid electric vehicle, or a power storage device.

12. The method of claim 1, wherein the SOC-CCV profile and the SOC-OCV profile are formed by setting the charge amount (SOC) on a horizontal axis and the closed circuit voltage (CCV) and the open circuit voltage (OCV) on a vertical axis, and plotting each measurement value on a graph.

* * * * *